(12) United States Patent
Hannah et al.

(10) Patent No.: US 7,292,069 B2
(45) Date of Patent: Nov. 6, 2007

(54) LOCALLY ASYNCHRONOUS, BLOCK-LEVEL SYNCHRONOUS, CONFIGURABLE LOGIC BLOCKS WITH SUB-THRESHOLD ANALOG CIRCUITS

(75) Inventors: Eric C. Hannah, Pebble Beach, CA (US); David Tennenhouse, Hillsborough, OR (US)

(73) Assignee: Intel Corporation, Santa Clara, CA (US)

( * ) Notice: Subject to any disclaimer, the term of this patent is extended or adjusted under 35 U.S.C. 154(b) by 52 days.

(21) Appl. No.: 11/323,950

(22) Filed: Dec. 30, 2005

(65) Prior Publication Data

US 2007/0194810 A1 Aug. 23, 2007

(51) Int. Cl.
*H03K 19/20* (2006.01)
*H03K 19/094* (2006.01)

(52) U.S. Cl. .................... 326/115; 326/37; 326/104; 326/127

(58) Field of Classification Search ............ 326/52–55, 326/37–39, 44–46, 49, 104, 112, 115, 119, 326/121, 126–127
See application file for complete search history.

(56) References Cited

U.S. PATENT DOCUMENTS 6,282,559 B1 * 8/2001 Helfenstein et al. ........ 708/801
2004/0136472 A1 * 7/2004 Vigoda et al. ............... 375/316

OTHER PUBLICATIONS

Rajagopalan, Kamal, et al., "A Flexible Multiplication Unit for an FPGA Logic Block", *IEEE International Symposium on Circuits and Systems (ISCAS 2001)*, vol. 4, (2001), 546-549, no month.
Tang, Halyun, et al., "On the Architectural Level Design of FPGA", *EE241 Midterm Report—Professor Jan Rabaey, Spring, 1997*, http://web.archive.org/web/20021115195250/http://bwrc.eecs.berkeley.edu/People/Grad_Students/ningzh/241/241midterm.html, (Archived Nov. 11, 2002), 4 pgs.

* cited by examiner

*Primary Examiner*—Anh Q. Tran
(74) *Attorney, Agent, or Firm*—Seth Z. Kalson

(57) ABSTRACT

Embodiments utilize analog sub-threshold circuits to perform Boolean logic and soft-gate logic. These analog circuits may be grouped into configurable logic blocks that are locally asynchronous, but block-level synchronous. The Boolean logic, or function, performed by these blocks may be configured by programming bits. Other embodiments are described and claimed.

21 Claims, 16 Drawing Sheets

LOCALLY ASYNCHRONOUS, BLOCK-LEVEL SYNCHRONOUS, CONFIGURABLE LOGIC BLOCKS WITH SUB-THRESHOLD ANALOG CIRCUITS

FIELD

Embodiments of the present invention relate to analog circuits, and in particular, to analog sub-threshold CMOS circuits.

BACKGROUND

High performance microprocessors utilize CMOS process technology. Historically, as CMOS (Complementary Metal Oxide Semiconductor) technology scales to smaller sizes, the energy expended per logic operation decreases, but this decrease slows down as the technology scales below 100 nanometers. In digital logic, the ratio of ON-current ($I_{ON}$) to OFF-current ($I_{OFF}$) for a transistor is important, where for CMOS logic, $I_{ON}$ for a transistor denotes the source-drain current when ON and $I_{OFF}$ denotes the source-drain current when OFF. Unfortunately, this ratio decreases as scaling decreases. This is due to transistors becoming leaky as the technology scales to smaller and smaller sizes. That is, transistors do not actually turn OFF, and the corresponding leakage current is somewhat substantial. Furthermore, as technology scales to smaller dimensions, various transistor characteristics become highly variable, such as threshold voltage, delay, and so forth. In particular, as technology scales below 0.18 microns, the expended power due to leakage, as a percentage of total power consumed, may rise substantially.

Accordingly, it is expected that as technology scales to smaller dimensions, other types of circuit technologies may be needed so that expended power does not become an issue. In this regard, sub-threshold CMOS circuits have been of interest to researchers because in some cases they may be designed as so-called ultra low power circuits. However, in the past, such sub-threshold CMOS circuits have been inadequate for high performance applications.

DESCRIPTION OF EMBODIMENTS

Low power sub-threshold CMOS circuits may be viable candidates for high performance systems as process technology scales well below 100 nanometers.

When a CMOS transistor is operating in a sub-threshold region, its drain-to-source current is relatively very small, such as on the order of a few nano-amps. When a transistor is operating in the sub-threshold region, it is said to be in weak inversion. A NMOS transistor is in its sub-threshold region if its gate-to-source voltage $V_{GS}$ is less than its threshold voltage, denoted as $V_{TN}$. That is, $V_{GS} < V_{TN}$. For a pMOS transistor, if we follow the convention that its threshold voltage, denoted as $V_{TP}$, is negative, then a pMOS transistor is in its sub-threshold region if its gate-to-source voltage is larger than $V_{TP}$. That is, $V_{GS} > V_{TP}$. Operating CMOS circuits in their sub-threshold regions may bring about a significant reduction in power, but also a reduction in performance because the switching times increase. However, if sub-threshold CMOS circuits are designed properly, there is an overall reduction in power consumed per performance metric. We shall discuss two types of circuits employing sub-threshold CMOS transistors. The first type of circuit discussed will be sub-threshold current-mode logic, and the second type of circuits discussed will be sub-threshold circuits used in soft-gates. We first begin the discussion with current-mode logic.

Figure 1:
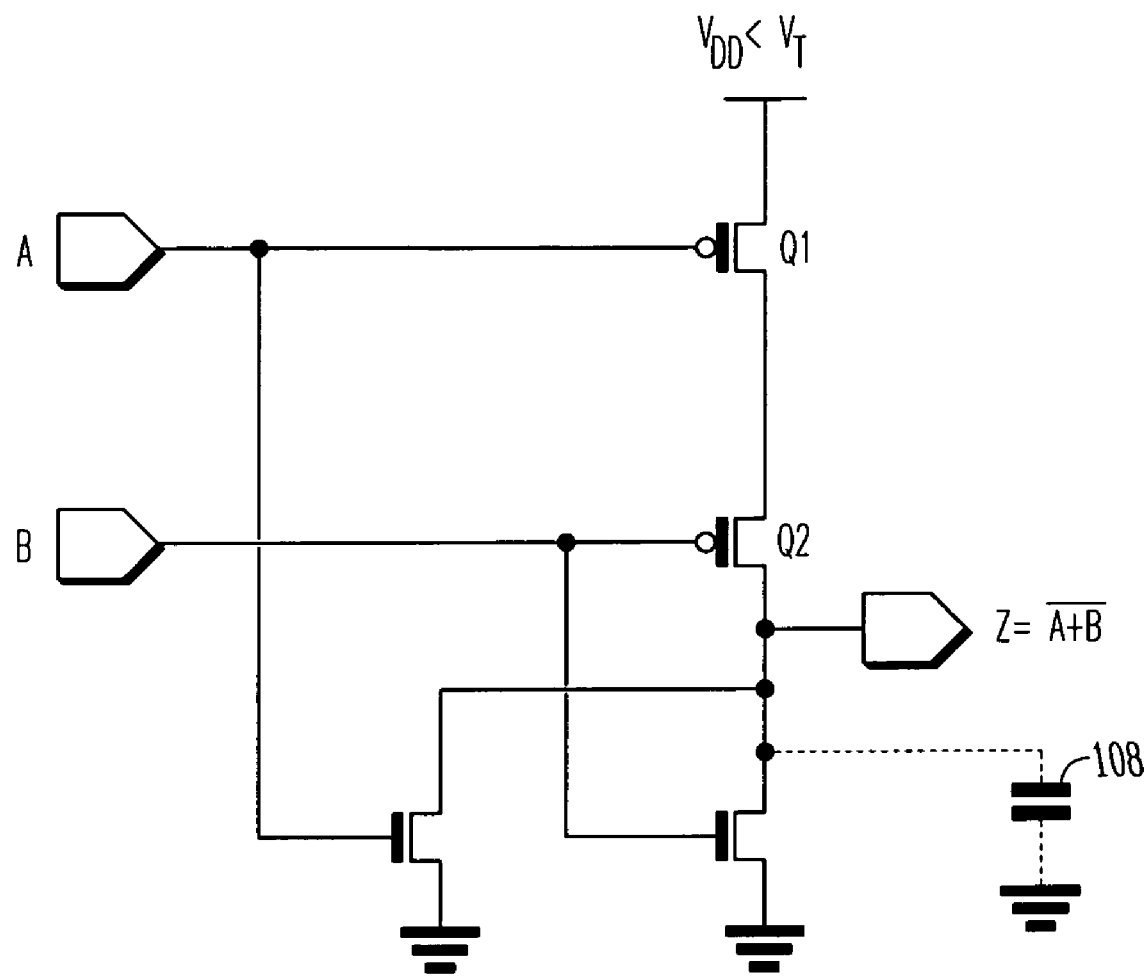
FIG. 1 illustrates a prior art sub-threshold CMOS logic gate.

FIG. 1 illustrates a standard CMOS logic circuit operating in its sub-threshold region. Note that in FIG. 1, we indicate the threshold voltage as simply $V_T$, a positive quantity, so that the pMOS transistors are in their sub-threshold regions because the supply voltage, $V_{DD}$, is such that $V_{DD} < V_T$. This is interpreted to mean that $V_T = -V_{TP}$. More precisely, if there are two pMOS transistors, where the two threshold voltages are denoted as $V_{TP1}$ and $V_{TP2}$, then $V_T = \min\{-V_{TP1}, -V_{TP2}\}$. Similar statements apply to circuits in which there is more than one nMOS transistor operating in a sub-threshold region. For example, for the case of two nMOS transistors, we would write $V_T = \max\{V_{TN1}, V_{TN2}\}$. In either case, for convenience of notation, we will simply use $V_T$ in various drawings as a generalized threshold voltage, and its actual definition should be clear from context.

The particular logic gate shown in FIG. 1 is a NOR gate. Input signals represented by A and B are applied at their respective input ports as indicated in Figure A, which are connected, respectively, of the gates of pMOS transistors Q1 and Q2. The output voltage signal is represented as Z at its respective output port, which is connected to the drain of pMOS transistor Q2. The output port will drive another logic gate which is not explicitly shown, but is represented by capacitive load 108. The rail or supply voltage $V_{DD}$ is applied to the source of PMOS transistor Q1, and is set at a voltage less than the threshold voltage $V_T$, as discussed earlier. In this way, when a LOW input voltage is applied, then the gate-to-source voltage for pMOS Q1 is such that pMOS Q1 is operating in its sub-threshold region. Accordingly, there is a lower dynamic current available to charge capacitive load 108, resulting in reduced speed of operation. Because the supply voltage has been reduced to a voltage less than the threshold voltage $V_T$, there is lower static leakage power when one of the input ports is brought HIGH, but there is a reduction in the difference in the output voltages for the ON and OFF states, thereby degrading noise immunity for this logic gate.

Figure 2:
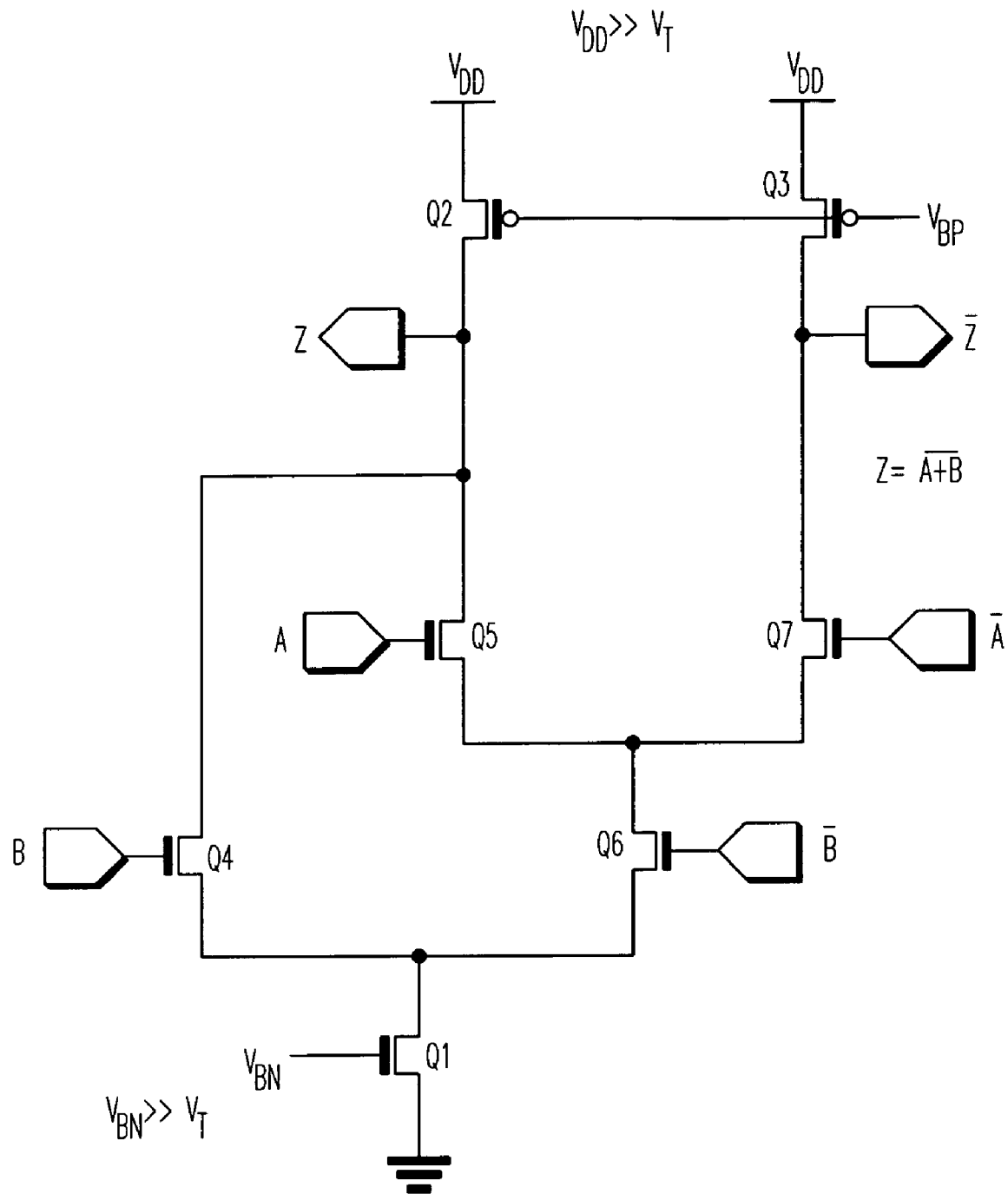
FIG. 2 illustrates a prior art current-mode logic NOR gate operating in a strong inversion region.

FIG. 2 illustrates a NOR gate employing current-mode logic but in which the transistors are operated in their strong inversion region. That is, they are not operating in their sub-threshold region. In this case, the supply voltage $V_{DD}$ substantially greater than the threshold voltage $V_T$. Input voltages, denoted as $\overline{A}$ and $\overline{B}$, are applied to their respective input ports, and their complementary voltages, denoted as A and B respectively, are applied to their respective input ports. The output voltages are complementary to each other, and are indicated as Z and $\overline{Z}$. In other words, there is a differential output provided by a current-mode logic gate. A bias voltage, $V_{BN}$, is applied to the gate of nMOS transistors Q1, and a bias voltage, denoted as $V_{BP}$, is applied to the gates of pMOS transistors Q2 and Q3.

When in operation, there is always a static bias current steered through some of the transistors, depending upon the input logic levels. The static bias current is set by the nMOS transistor Q1. If the input voltage to input port B is high, then the static bias current is steered through transistors Q2 and Q4 and to ground via transistor Q1. Now, suppose that the input voltage B is LOW so that its complementary voltage $\overline{B}$ is HIGH. Then, if the input voltage A is HIGH, the static bias current is steered through transistors Q2, Q5, and Q6 to ground via transistor Q1. But, if the input voltage A is LOW, then accordingly, its complementary voltage, $\overline{A}$, is HIGH, and, static bias current is steered through transistors Q3, Q7, Q6, and to ground via Q6.

The presence of pMOS transistors Q2 and Q3 reduces the overall voltage swings at the output ports. Very high speed operation may be possible because in a sense the logic gate is always ON; all that is changed is the path through which the bias supply current is steered. Because of the differential output, power supply noise and ground noise are coupled to the output signals as a common-mode signal, which may be cancelled out from the differential output voltage. However, there is a relatively high static power dissipation due to the high bias current and supply voltage. Note that the bias voltage supplied to the gate of transistor Q1 may be taken LOW to turn the entire logic gate OFF if the logic gate is not being used.

Figure 3:
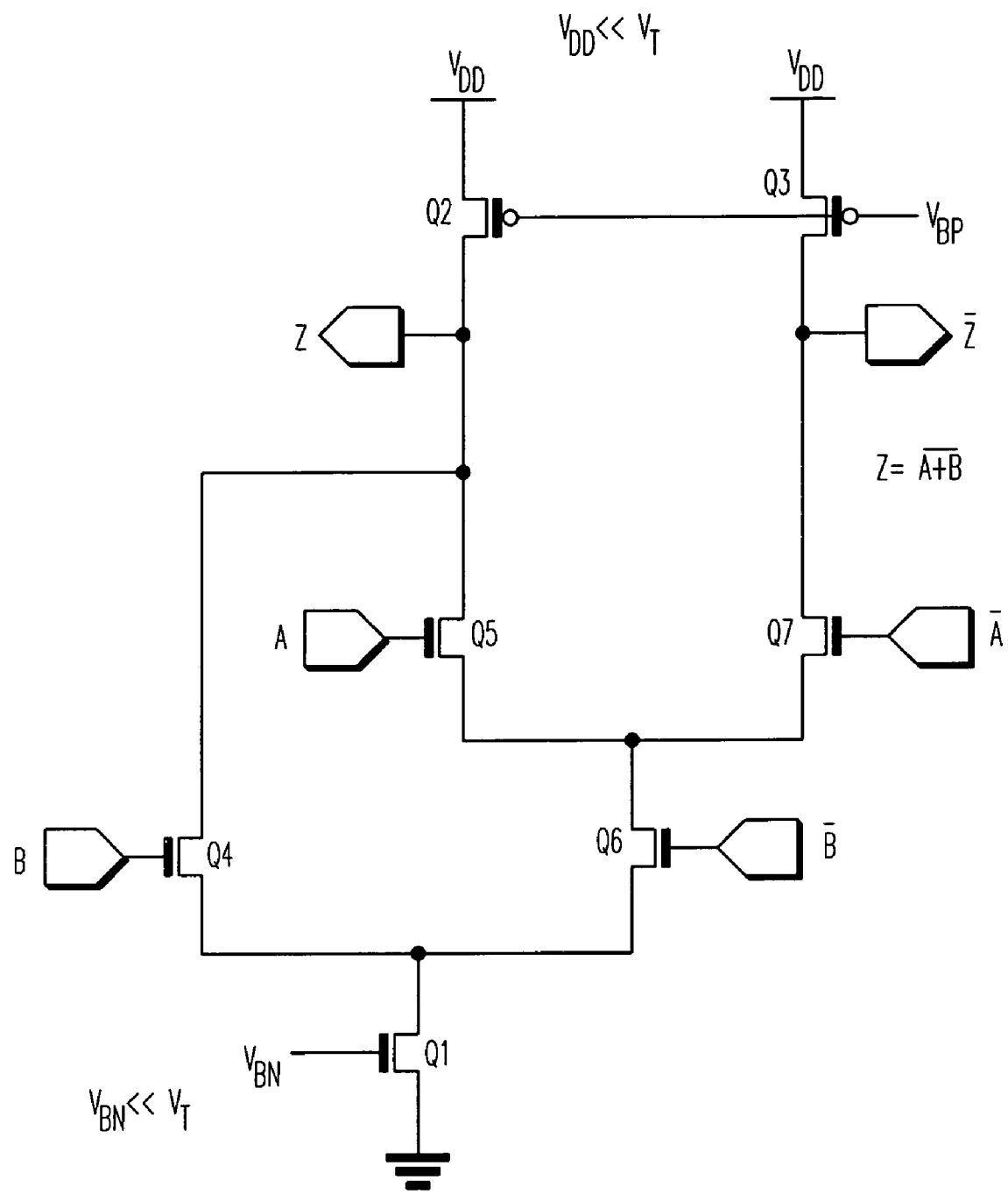
FIG. 3 illustrates a prior art sub-threshold, current-mode logic NOR gate.

FIG. 3 illustrates a logical NOR gate in which the transistors are operating in their sub-threshold region, but in which current-mode logic is employed. The operation is similar to the circuit discussed earlier in FIG. 2; however the supply voltage is substantially less than the threshold voltage, and there are greatly reduced bias currents and voltage swings. The bias voltage applied to transistor Q1 is set to be less than the threshold voltage so that transistor Q1 is operating in its sub-threshold region. Effectively, the source-drain current is the OFF-state leakage current, and this leakage current is the bias current for the logic gate. As in FIG. 2, input voltages A and B are applied to their respective input ports, and their complementary voltages are applied to their respective input ports. When the input voltage B is HIGH, the bias current is steered through pMOS transistors Q2 and Q4 to ground via NMOS transistor Q1. Now suppose that the input voltage B is LOW, so that its complementary voltage is HIGH. If input voltage A is HIGH, then the bias current is steered through transistors Q2, Q5, and Q6 and to ground via transistor Q1; but if the input voltage A were HIGH, then the bias current is steered through transistors Q3, Q7 and Q6 to ground via transistor Q1.

We see that the way in which the currents are steered is similar to the previous logic gate discussed in FIG. 2, but because transistor Q1 is operating in its sub-threshold region, only leakage currents are available to bias the transistors, and the maximum switching frequency is reduced due to the lower current drive capability. However, there still is good noise immunity due to the differential output voltage. Furthermore, there is greatly reduced power dissipation because of the low supply voltage and the very low bias current.

Maintaining a controlled differential output voltage swing is important for correct operation of current-mode logic gates. If the output voltage swing is too high, for example, then gate delay may be unnecessarily too large. On the other hand, if the output voltage swing is too low, then the logic "gain" is less than one, in which case the gate delay of any following stage may be increased.

Figure 4:
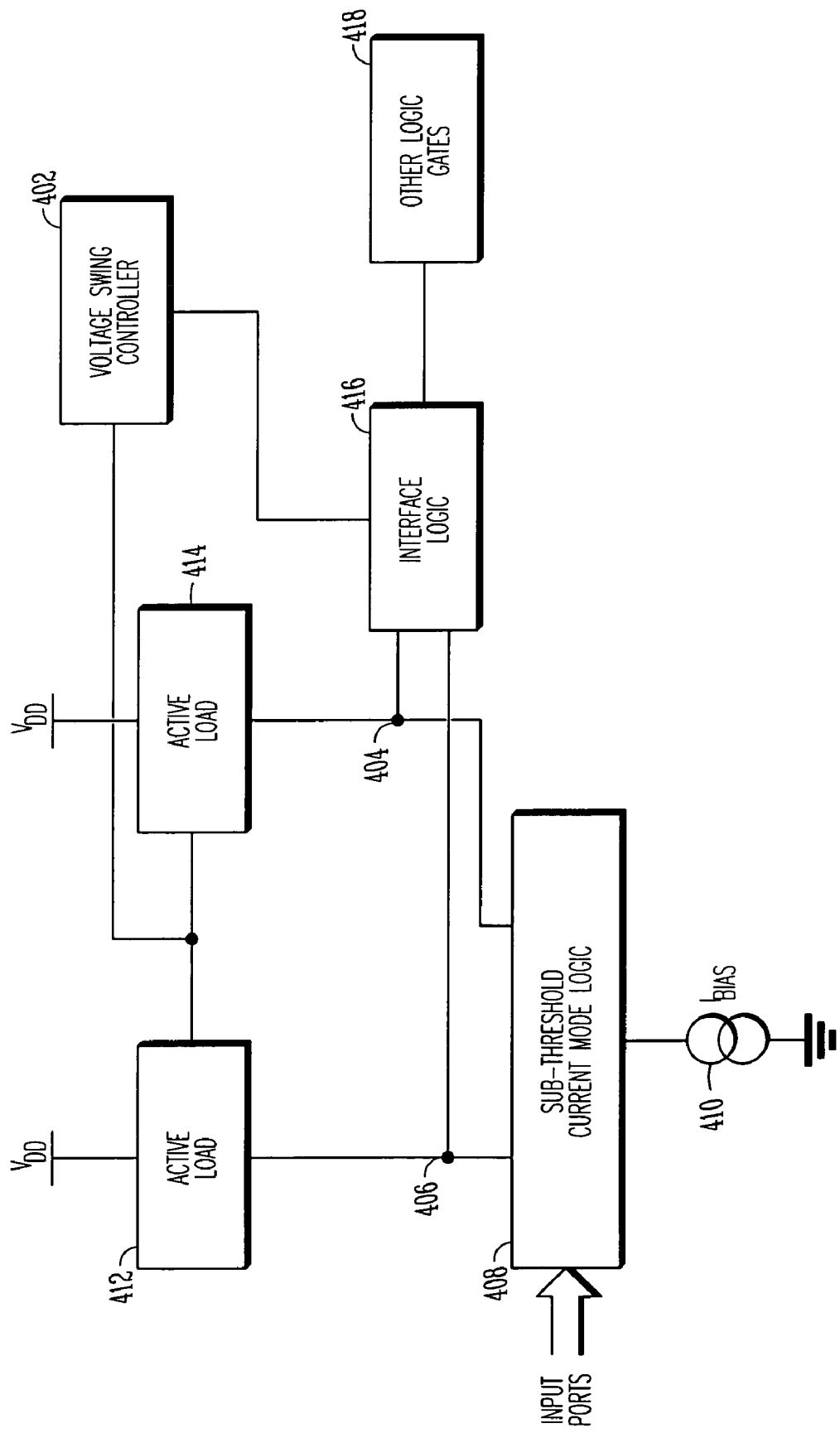
FIG. 4 illustrates a high-level abstraction of a prior art sub-threshold, current-mode logic gate with differential voltage swing controlling.

A sub-threshold CMOS logic gate employing current-mode logic may be abstractly represented as in FIG. 4, where functional unit 402 is a voltage swing controller so as to control the differential output voltage at output ports 404 and 406. Functional unit 408 represents a set of transistors, some or all in their sub-threshold region, in which their gates are responsive to the input voltages to the logic gate. Functional unit (or block) 410 indicates a bias current source for providing a sub-threshold bias current to sub-threshold block 408. In practice, functional unit 410 may simply be a transistor biased so as to operate in its sub-threshold region. Active loads are indicated by functional units 412 and 414, with the supply voltage $V_{DD}$ provided to these active loads.

The output port voltages from output ports 404 and 406 are provided to interface block 416. Interface block 416 thresholds the output voltages so that they are restored to their full logic values. These full logic voltages may drive other current-mode logic gates, represented by block 418. Voltage swing controller 402 monitors the voltages applied to interface block 416 and applies bias voltages to active loads 412 and 414 so as to maintain the proper differential output voltage.

Figure 5:
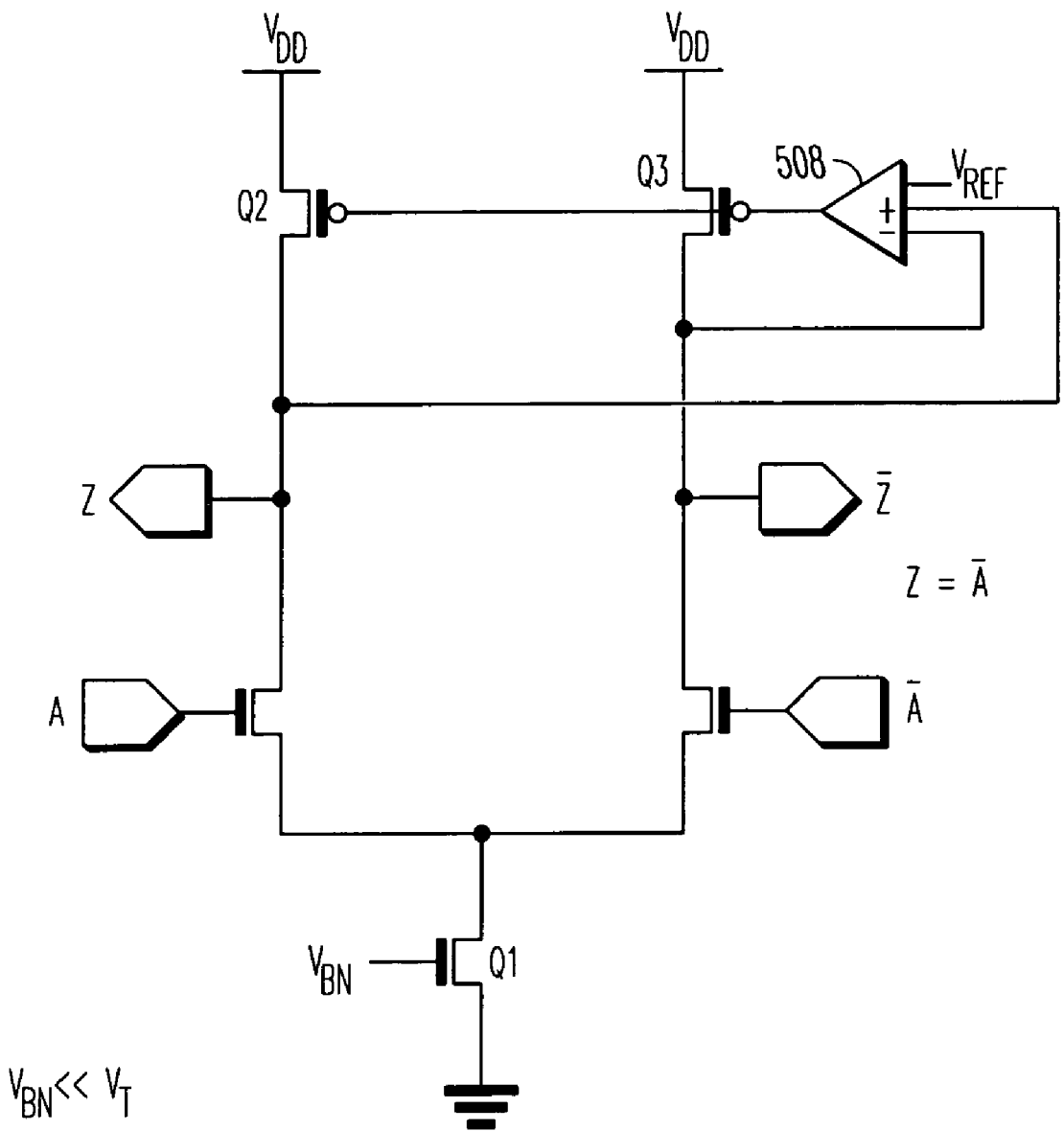
FIG. 5 illustrates an example of a prior art sub-threshold, current-mode logic inverter gate employing closed loop load biasing to control the differential voltage swing.

FIG. 5 illustrates a current-mode logic inverter gate employing sub-threshold transistors. The output differential voltage is controlled using closed loop load biasing. The sub-threshold bias current is provided by transistor Q1, in which its gate is biased by a bias voltage denoted by $V_{BN}$. The differential output voltages developed at output ports Z and $\overline{Z}$ are provided to the input ports of comparator 508. Comparator 508 compares the differential output voltage to a reference voltage $V_{REF}$, and provides a bias voltage to the gates of pMOS transistors Q2 and Q2. This bias voltage gate voltages applied to is adjusted so that the output voltage swings are maintained at the reference voltage $V_{REF}$.

Figure 6:
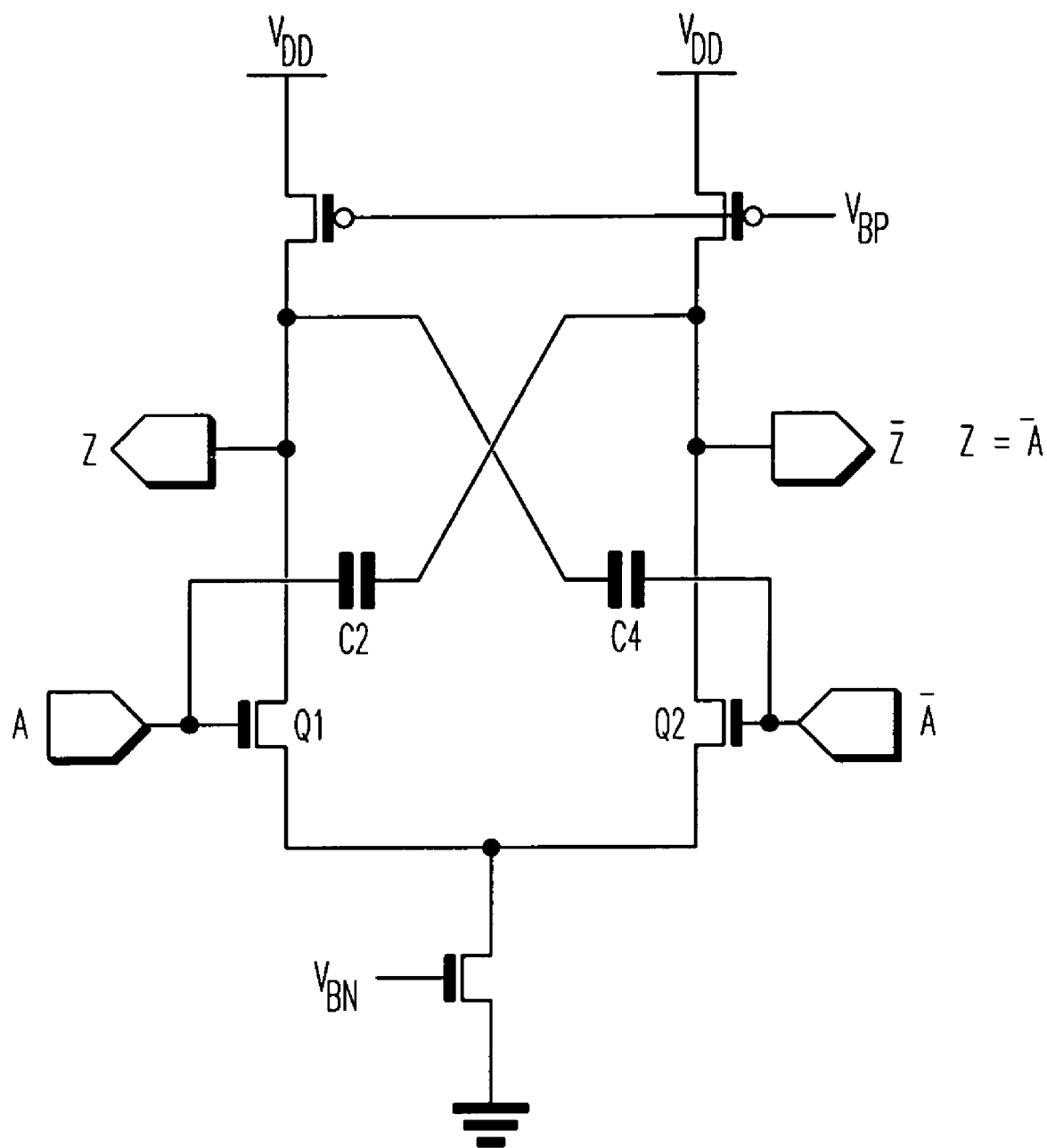
FIG. 6 illustrates an example of a prior art sub-threshold, current-mode logic inverter gate employing cross-coupled capacitors to cancel out the effects of drain-source capacitance.

FIG. 6 illustrates a current-mode logic inverter utilizing cross-coupled capacitors C2 and C4 to cancel out effects of drain-source capacitance by injecting equal and opposite currents. This technique has previously been used in conventional logic gates to increase operating bandwidths, as well as for high speed analog amplifiers and strong inversion current load logic gates. This technique of using cross-coupled capacitors may reduce gate delays by two to ten times, depending upon the matching of the capacitances of the cross coupling capacitors C2 and C4 with the drain-source capacitance of transistors Q1 and Q2. Although the particular logic gate illustrated in FIG. 6 is an inverter gate, it should be clear how such cross-coupled capacitors may be used in more complicated gates.

Figure 7A:
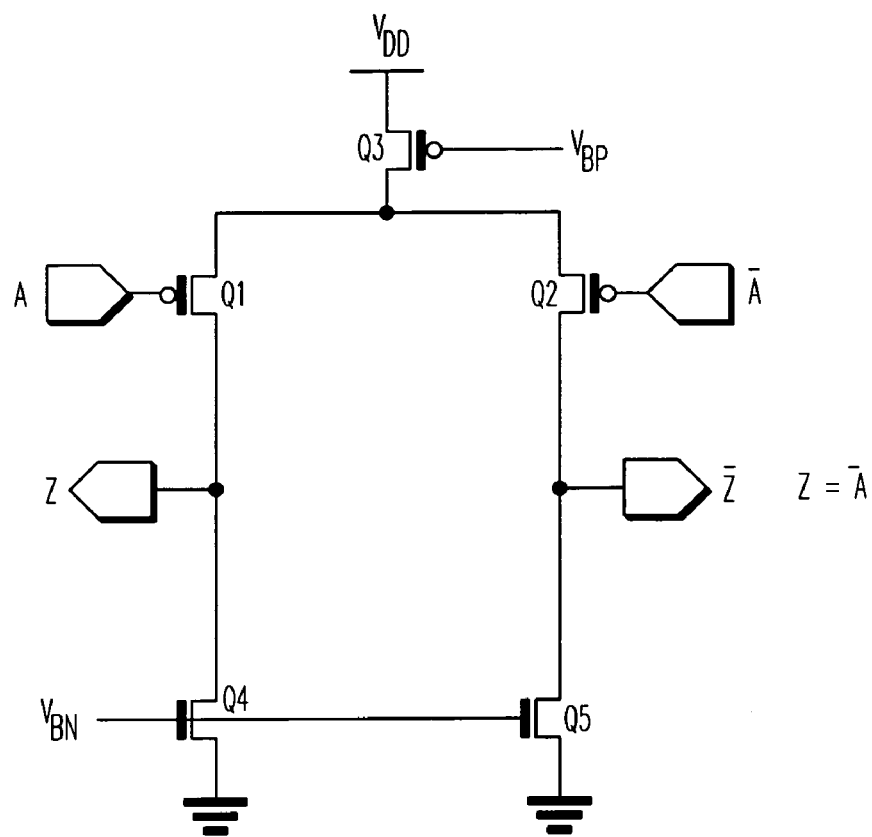
FIG. 7A illustrates a prior art pMOS type, sub-threshold, current-mode logic inverter gate.
Figure 7B:
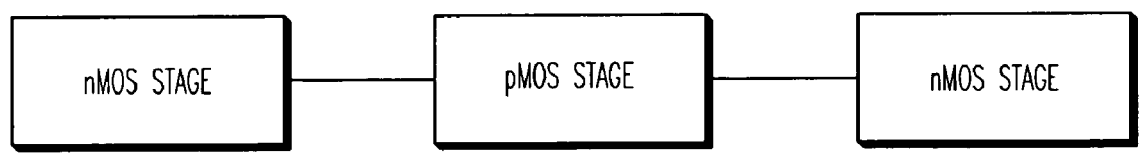
FIG. 7B represents the cascading of complementary, sub-threshold, current-mode logic gates.

Current mode logic gates for high speed operation are traditionally implemented using nMOS transistors as steering devices with resistive loads. Implementing cascaded complementary current-mode logic gates may enhance operation at low supply voltages. FIG. 7A illustrates a pMOS current-mode logic inverter gate operating in a sub-threshold region. The input voltages are applied to the gates of pMOS transistors Q1 and Q2. Bias current supplied to transistors Q1 and Q2 is provided by pMOS transistor Q3. nMOS transistors Q4 and Q5 serve as active loads. The gate of pMOS transistor Q3 is biased at a bias voltage, denoted by $V_{BP}$. As indicated in FIG. 7B, one may cascade a series of stages, alternating between NMOS type current-mode logic gates and pMOS type current-mode logic gates.

We now turn the discussion to soft-gates using sub-threshold CMOS circuits. A soft-gate is a logical device for passing probabilities. They are useful for implementing Bayesian networks. Bayesian networks are graphical models that map together existing beliefs about the relationships between events, and provide a mathematical rule explaining how to change those beliefs in light of new evidence. Such networks may find application to computationally demanding decision-making applications such as expert systems, decoding turbo codes, and other decision and communication problems.

Consider a simple soft-gate relating three Boolean variables: x, y, and z. Associated with each of these variables is a probability function. For example, we have for x a probability that it is either equal to one or zero. Similar statements apply to other variables. We denote these probability functions for x, y, and z as $p_x(x)$, $p_y(y)$, and $p_z(z)$, respectively. The variables x, y, and z are related to each other by some Boolean relationship. This Boolean relationship may be represented by the function f(x, y, z), where f=1 when x, y, and z satisfy the Boolean relationship and f=0 otherwise. Using f(x, y, z), the probability functions are related by $$p_z(z) = \gamma \sum_x \sum_y p_x(x) p_y(y) f(x, y, z), \quad (1)$$

where γ is a normalization constant so that $p_z(0)+p_z(1)=1$. The above expression gives a method for computing the probability function of z given the probability functions for the variables y, and z.

As an example, consider the exclusive-OR gate z=x⊕y, where ⊕ is the exclusive-OR operator. That is, z=1 if and only if x #y. The function f(x, y, z) for representing this Boolean relationship may be expressed as $$f(x,y,z)=\delta(x \oplus y \oplus z=0), \quad (2)$$

where δ(TRUE)=1 and δ(FALSE)=1.

Using the expression in Eq. (2) for the function f(x, y, z) in Eq. (1), one easily obtains the probabilities for the variable z:

$$p_z(1)=p_x(0)p_y(1)+p_x(1)p_y(0), \quad (3)$$

$$p_z(0)=p_x(0)p_y(0)+p_x(1)p_y(1). \quad (3)$$

Figure 8:
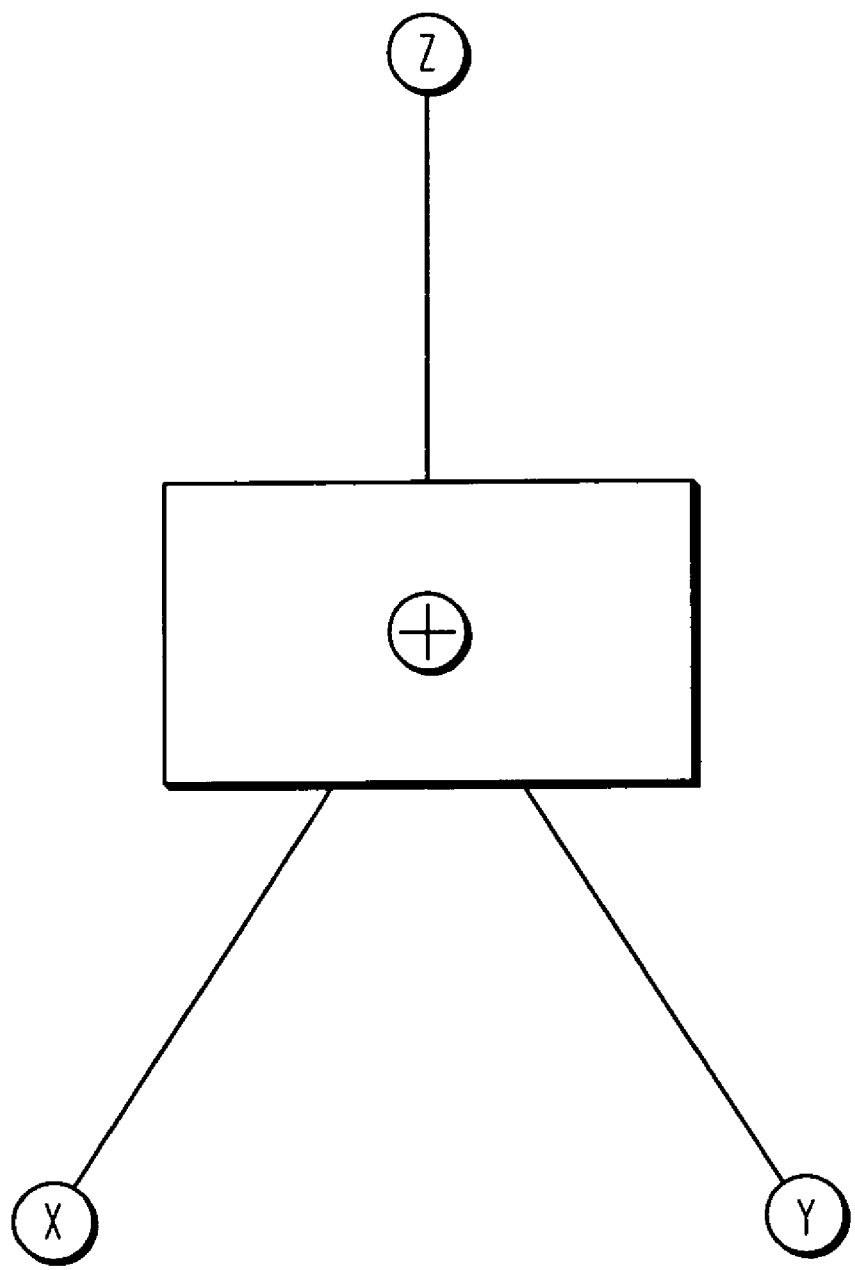
FIG. 8 illustrates a prior art factor graph for an exclusive-OR soft gate.

The soft exclusive-OR gate may be represented by the factor graph shown in FIG. 8. A factor graph imposes constraints on joint probability distributions over variables expressed in the graph. Variables are indicated by circles in the factor graph and rectangles denote functions. The circles are usually called variable nodes and the functional blocks are called factor nodes.

Figure 9:
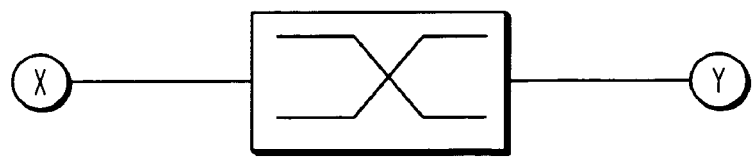
FIG. 9 illustrates a prior art factor graph for an inverter soft gate.

As another example of a factor graph, an inverter soft-gate is shown in FIG. 9. For the factor graph of FIG. 9, the probabilities of the variables x and y are given simply by $p_y(0)=p_x(1)$ and $p_y(1)=p_x(0)$.

Figure 10:
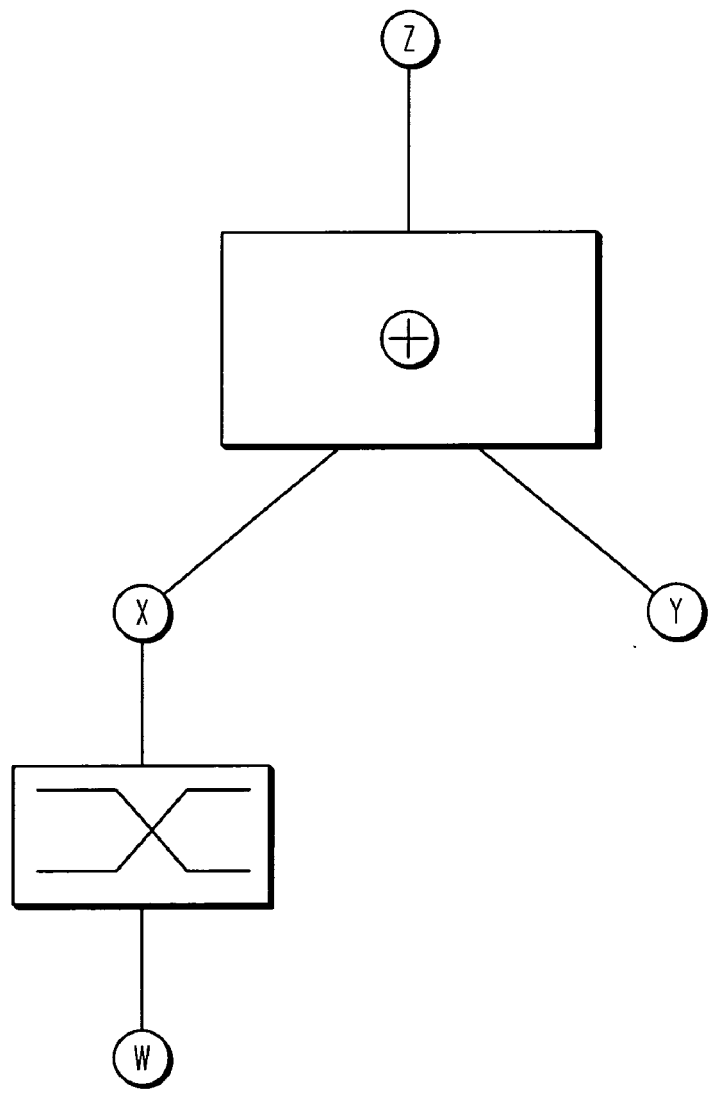
FIG. 10 illustrates a prior art factor graph for a soft gate comprising a soft inverter and a soft exclusive-OR gate.

A more complicated soft-gate may be represented using simpler soft-gates as building blocks. For example, FIG. 10 shows a factor graph which combines a soft-gate inverter with an exclusive-OR soft-gate. To find the marginal probability of the variable z given the marginal probabilities of w and y, first find the probability of x from probability of y, which is simply given by the result for a soft-gate inverter, and next find the probability of z from the probabilities of x and y as given by a soft-gate exclusive-OR. In a sense, the variable nodes pass probabilistic messages on a factor graph.

Bayesian networks are useful because they can model expert knowledge systems. Bayesian networks may be represented as factor graphs, but in practice such factor graphs may be relatively complicated, and calculating the marginal probabilities may be somewhat difficult. An algorithm called a sum-product algorithm has been developed for the efficient calculation of marginal probabilities associated with factor graphs. We do not need to discuss this algorithm in this description. The algorithm may be found in various references related to factor graphs. See for example "Factor Graphs and the Sum-Product Algorithm", F. R. Kschischang, et al., IEEE Transactions on Information Theory, Vol. 47, no. 2, February 2001.

As its names implies, the sum-product algorithm involves forming sums and products. As a simple example, considering the exclusive-OR soft-gate in Eq. (3). We see that the marginal probability for the variable z in terms of the marginal probabilities for the variables x and y involve products and sums. These operations may be performed in analog circuits, and sub-threshold circuits may be utilized to perform these computations. Sums are very easy to synthesize for we only need make use of Kirchhoff's Current Law in which the sum of currents into a node must sum to zero. So to perform an addition operation, we need only short one wire to another. Performing a product or a multiplication is of course more difficult, but sub-threshold CMOS circuits may be used for such operations.

Suppose we have two quantities, a and b, that we wish to multiply to form a third quantity, c. This multiplication could be accomplished by taking the logarithm of a and adding to that the logarithm of b. This sum of logarithms is merely the logarithm of c, so to find c, we merely take the antilog of that expression. That is, as is well known, for c=ab, we have ln(c)=ln(a)+ln(b). Sub-threshold circuits synthesizing the exponential function and the log function may be utilized to synthesize the product operation.

It has been well known for some time that bipolar junction transistor circuits may be synthesized to perform the exponential operation, and that diode-connected transistors may be used for the logarithm operation. See, for example, "A precise Four-Quadrant Multiplier with Subnanonsecond Response," B. Gilbert, IEEE Journal on Solid State Circuits, Vol. 3, Issue 4, 1968, pp. 365-373. It is also well known that these functions may also be synthesized using sub-threshold CMOS transistors. See for example, "Analog VLSI and Neural Systems", Carver Mead, Addison-Wesley, 1989, and a more recent discussion by Samuel Luckenbill in http://www.eng.vale.edu/pik/EESrProi O₂/Luckenbill html/node5.htmlas.

For sub-threshold NMOS transistor operating in its saturation mode so that changes in the source-drain voltage do not affect the drain-source current, the source-drain current is given by the expression $$I = I_S \exp(V_{GS}/V_T), \tag{4}$$

where $V_{GS}$ is the gate-to-source voltage and $I_S$ is a saturation current. A diode connected sub-threshold CMOS transistor is usually in saturation, so that Eq. (4) would apply. Solving for the gate-source voltage in Eq. (4), one obtains $$V_{GS} = V_T \ln(I/I_0), \tag{5}$$

and we see that the gate-to-source voltage is proportional to the logarithm of the ratio of the source drain current I to the saturation current $I_S$. So, generally speaking, we see from Eq. (5) that a diode-connected sub-threshold transistor gives a voltage as a logarithm of a current. To synthesize a multiplier, we also need a circuit that takes the exponential of a voltage and outputs of current. This exponential function can be synthesized by a differential pair of transistors.

Figure 11:
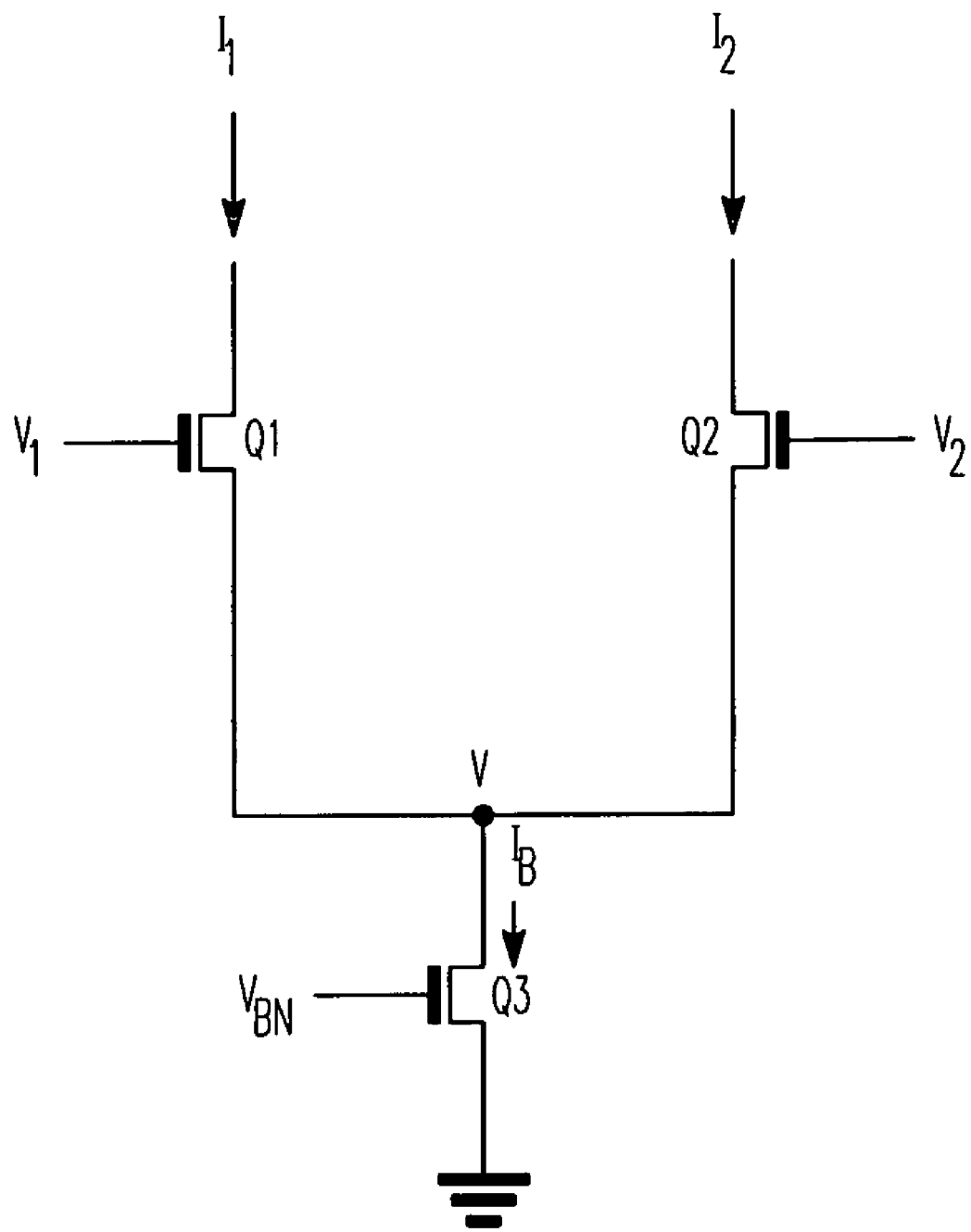
FIG. 11 illustrates a prior art differential pair circuit in sub-threshold operation.

A differential pair is illustrated is in FIG. 11. Transistors Q1 and Q2 are operated in their sub-threshold region in saturation. Transistor Q3 has its gate biased by bias voltage $V_{BN}$ to provide a bias current $I_B$. Denoting the source-drain current of transistor Q1 as $I_1$ and the source-drain current of transistor Q2 as $I_2$, we have the simple relationship $$I_1 + I_2 = I_B, \tag{6}$$

where these currents are given by $$I_1 = I_S \exp[(V_1 - V)/V_T]$$

$$I_2 = I_S \exp[(V_2 - V)/V_T] \tag{7}$$

where V denotes the voltage at the node labeled "V" in Fig. K. As shown in Luckenbill, cited above, Eqs. (6) and (7) may be manipulated to yield Eqs. (8) and (9) below:

$$I_1 = \frac{\exp(V_{BN}/V_T)\exp(V_1/V_T)}{\exp(V_1/V_T) + \exp(V_2/V_T)}, \tag{8}$$

$$I_1 = \frac{\exp(V_{bn}/V_T)\exp(V_2/V_T)}{\exp(V_1/V_T) + \exp(V_2/V_T)}. \tag{9}$$

Figure 12:
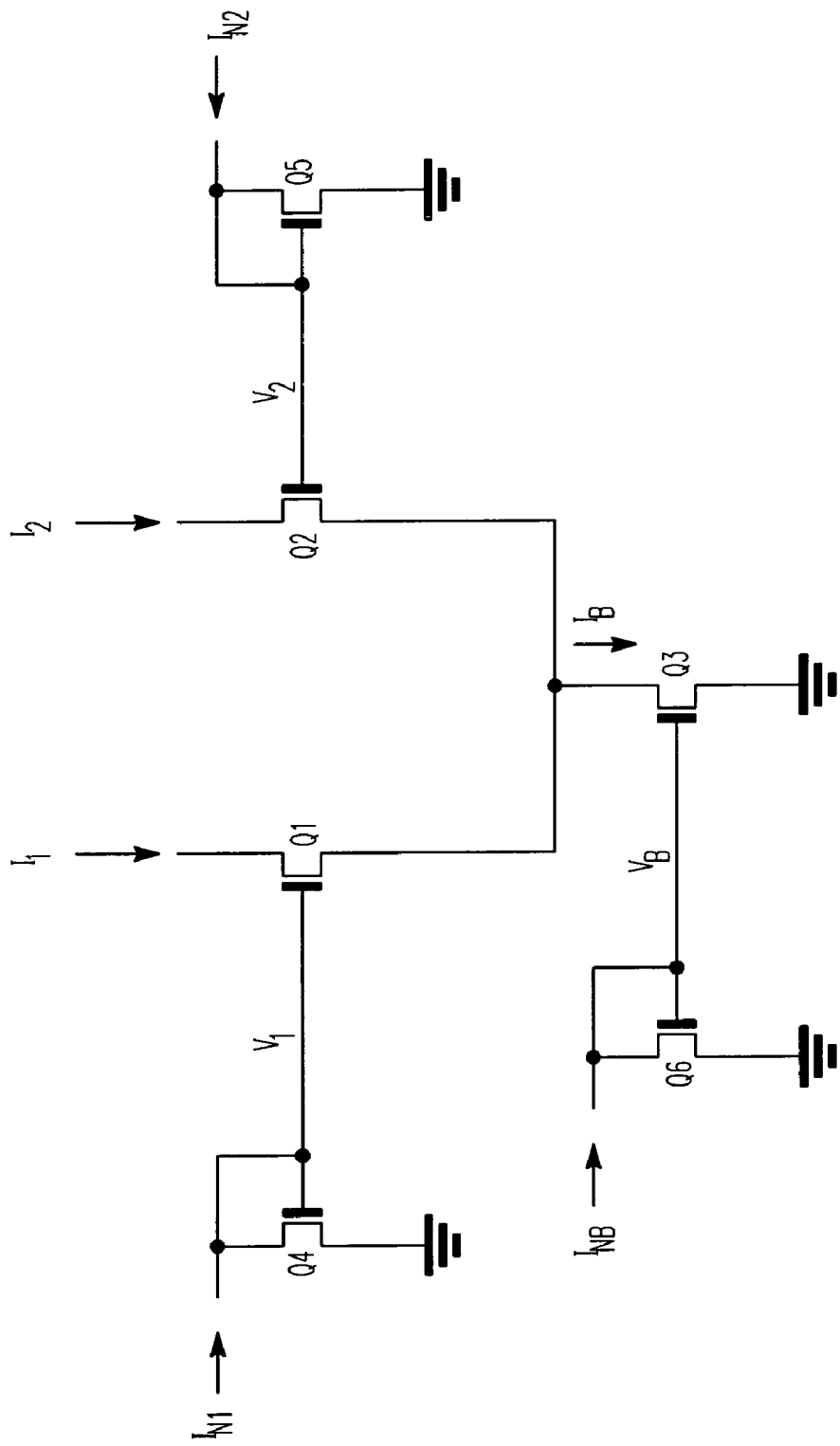
FIG. 12 illustrates a prior art sub-threshold CMOS multiplier circuit.

The above two equations look like they perform the exponential function as desired, except perhaps for the terms appearing in their denominators. But these terms in the denominators may be eliminated by combining a differential pair with three diode-connected transistors connected as current mirrors. This is illustrated in the circuit of FIG. 12. In FIG. 12, transistors Q3 and Q6 comprise a current mirror, transistors Q1 and Q4 comprise a current mirror, and transistors Q2 and Q5 comprise a current mirror. With the various currents labeled as indicated in FIG. 12, utilizing Eqs. (8) and (9), one obtains the following expressions:

$$I_1 = I_{N1} = I_s \exp(V_1/V_T), \tag{10}$$

$$I_1 = \frac{I_{NB} I_{N1}}{I_{N1} + I_{N2}}, \tag{11}$$

$$I_2 = \frac{I_{NB} I_{N2}}{I_{N1} + I_{N2}}. \tag{12}$$

If now the following expression holds:

$$I_{N1} + I_{N2} = 1, \tag{13}$$

then from Eqs. (10) and (12) we obtain the results:

$$I_1 = I_{NB} I_{N1}, \tag{14}$$

$$I_2 = I^{NB} I_{N2}. \tag{15}$$

The above two equations show that the circuit of FIG. 12 does indeed perform the multiplication operation that we desire, provided Eq. (13) holds. If the current $I_{N1}$ represents the probability of an event happening and the current $I_{N2}$ represents the probability of that event not happening, then their sum must be one, which would satisfy Eq. (13). By requiring these currents to represent probabilities, we arrive at the multiplication operations as indicated in Eqs. (14) and (15). This is the reason why one computes both products as indicated by these two equations. In general, the circuits that we desire will be differential in nature.

Figure 13:
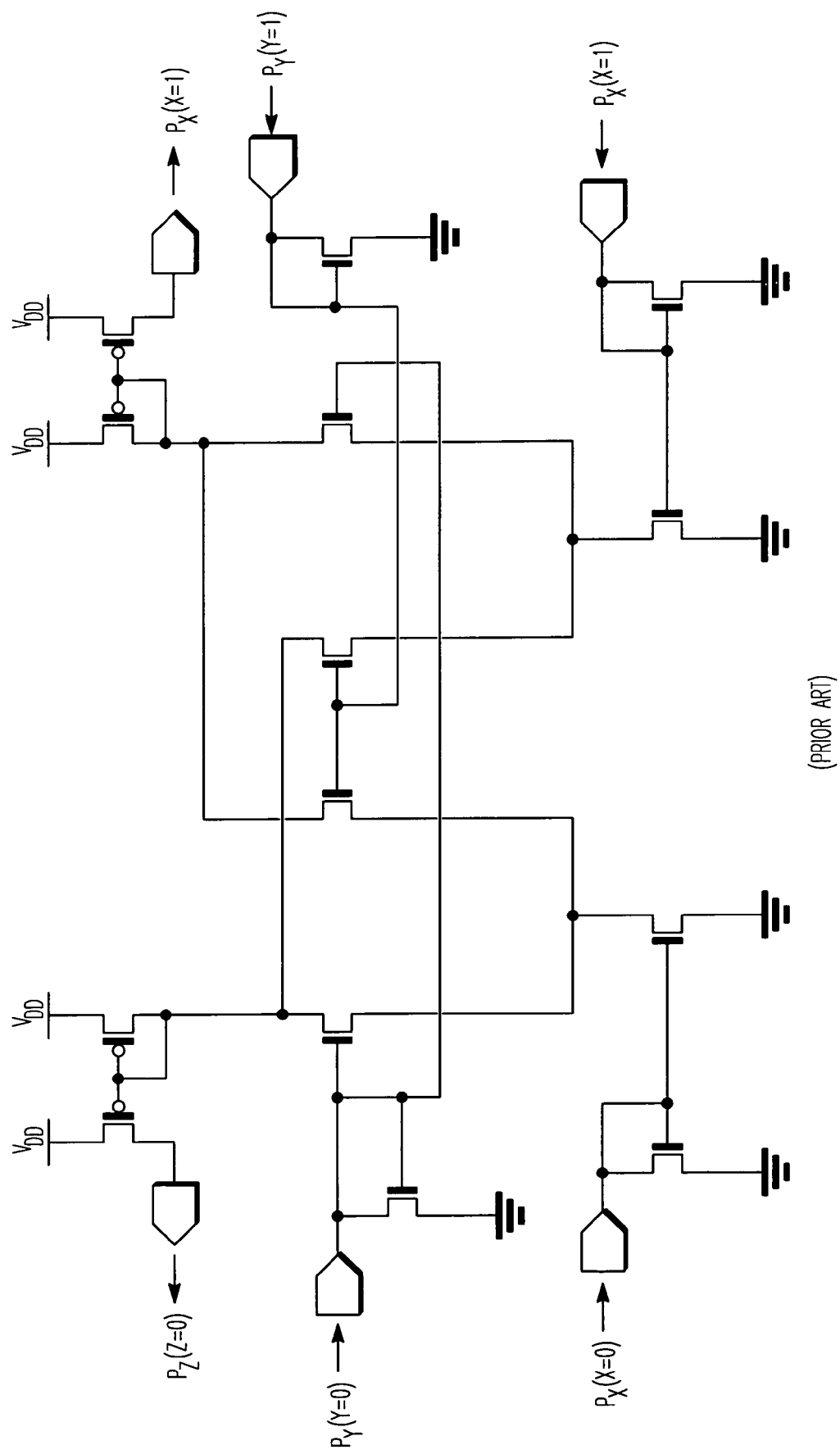
FIG. 13 illustrates a prior art sub-threshold CMOS circuit for an exclusive-OR soft gate.

As an example, a sub-threshold circuit for synthesizing an exclusive-OR soft-gate is given in FIG. 13. In FIG. 13, the probabilities listed are the values of the currents that are provided at the various input ports or sourced at the various output ports. The result is that the circuit of FIG. 13 performs the products and sum as desired in Eq. (3) for a soft-gate performing the exclusive-OR operation. Although somewhat tedious, the building blocks discussed so far may be used to synthesize more complicated soft-gates.

We see that sub-threshold transistors have many advantages. Sub-threshold transistors employed in current-mode logic circuits may achieve very low power dissipation and may be used to synthesize conventional Boolean logic gates. Sub-threshold transistors may also be utilized to perform products which may be used to implement soft-gates with applications to Bayesian networks. Despite these advantages, analog circuits have their own scaling limits. Analog circuits are generally not fully modular, so that redesign of one part often requires redesign of all the other parts. Analog circuits are not easily scalable because a new process technology may change enough parameters of some parts of the circuit so that a full re-design is needed. By contrast, digital circuits are modular, so that re-design for a new process technology may be as simple as re-designing a few logic gates.

This design problem may be overcome by utilizing configurable logic blocks. Gate arrays pioneered the idea of using reconfigurable logic blocks between clocked registers to form flexible digital circuits. Within such a block, there is a free propagation of signals between logic elements that compute a desired Boolean expression. The exact Boolean expression computed is set by storing programming bits inside each configurable logic block at power start time or by programming switches in some initialization procedure. Clock synchronization inside the chip occurs via register transfer operations on the edges of each configurable logic block on the clock transitions.

Figure 14:
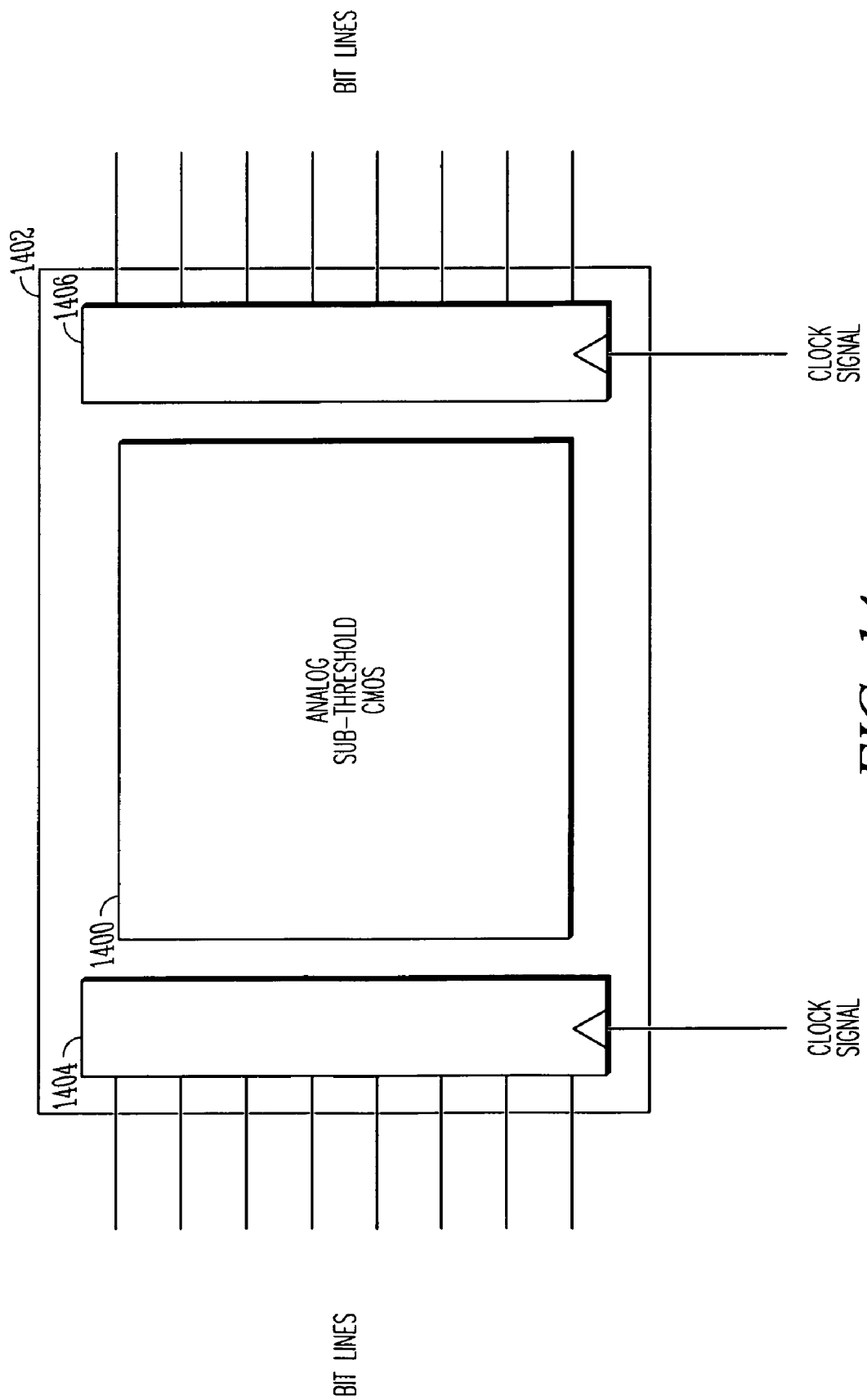
FIG. 14 illustrates a configurable logic block with an analog sub-threshold CMOS circuit and clocked registers according to an embodiment of the present invention.

In an embodiment illustrated in FIG. 14, configurable logic block 1402 comprises sub-threshold transistor circuits, indicated by block 1406, which may be current-mode logic or soft-gate structures, or perhaps a combination of both. The circuits inside block 1406 may be run asynchronously. Configurable logic block 1402 may be programmable, or may provide a fixed function. The "edges" of configurable logic block 1402 are clocked registers 1404 and 1406. These clocked registers enforce time synchronization with some global clock signal to ensure that each input line and output line feeding into or out of the clocked registers is thresholded to some valid logic level.

It is expected that the approach illustrated in FIG. 14 may simplify the analog design burden to a small number of well defined computations that are isolated from other analog functions on a chip employing such configurable logic blocks. That is, the overall approach may be viewed as being locally asynchronous, but block-level synchronous.

Figure 15:
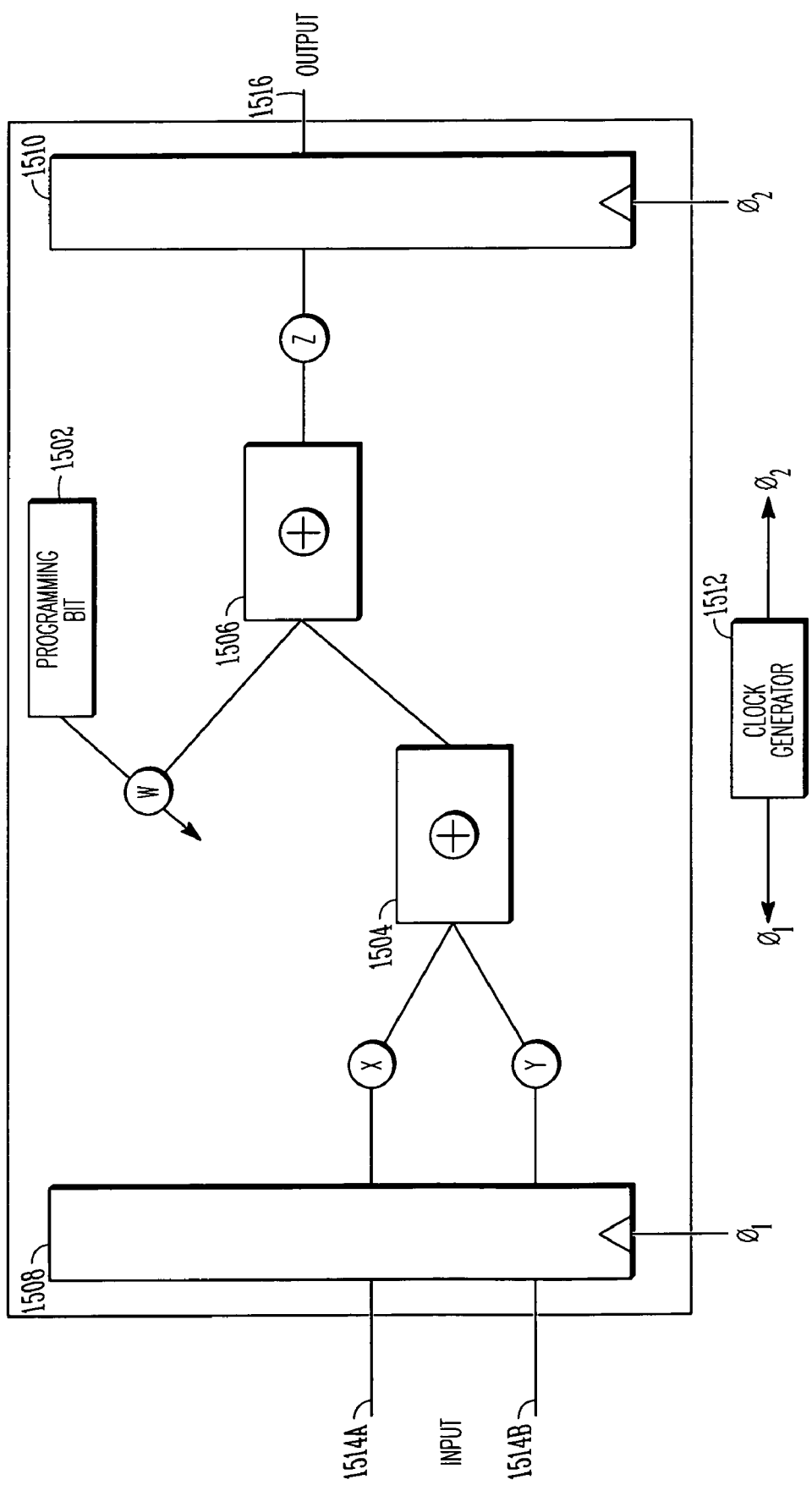
FIG. 15 illustrates a configurable logic block with a programmable soft-gate according to an embodiment of the present invention.

FIG. 15 illustrates an example of a locally asynchronous, block-level synchronous configurable logic gate employing an analog sub-threshold circuit. In this example, a programming bit is stored in functional unit 1502. That is, functional unit 1502 has a state indicative of the programming bit. This programming bit is used to set the variable node w in FIG. 15. Factor nodes 1504 and 1506 are exclusive-OR soft-gates. Two input signals are clocked by clocked register 1508, and are provided to variable nodes x and y. The output variable is z. If the programming bit stored in functional unit 1502 is such that the variable w is held at 0, then the input-output Boolean function is z=x⊕y. If, however, the programming bit for functional unit 1502 is such that the variable w is held at 1, then the input-output Boolean function is $$z = x \oplus y \oplus 1 = \overline{x \oplus y}. \quad (16)$$

The resulting input-output soft-gate function for the configurable logic block of FIG. 15 is set by the programming bit. It should be noted that FIG. 15 is an illustration at the soft-gate level. In practice, to pass the various probabilities using sub-threshold CMOS circuits as described earlier, probabilities and their complements are passed. For example, for the programmed variable node w, there will be two currents sourced at the circuit level, say $I_{W1}$ and $I_{W2}$. If the programming bit represents one state in which $I_{W1}=1$ and $I_{W2}=0$, then for the complementary state, $I_{W1}=0$ and $I_{W2}=1$. Similarly, the input signals for variable nodes x and y are currents and their complements, (representing probabilities and their complements), and the output signal for the variable node z is a current and its complement (representing a probability and its complement).

Clocked registers 1508 and 1510 may be clocked by two clock signals, indicated in FIG. 15 by $\phi_1$ and $\phi_2$, which may be generated by clock generator 1512. These clock signals are synchronized to each other, but may be phase shifted with respect to each other, so that the configurable logic block may propagate various internal currents so that clocked register 1510 is clocked to store the final outputs before clocked register 1508 is clocked to accept new input bits. so that clocked register 1508 is clocked to "store" the input bits to the configurable logic block.

Note that in the above description regarding the currents $I_{W1}$ and $I_{W2}$, we have assumed that they sum up to one. This assumption is also applied to the other currents that represent the various probabilities and their complements. However, this assumption is maintained merely for simplicity of discussion, and ignores the units used to represent currents. In practice, one need only require that the various currents and their complements sum to some fixed number. A final scaling may then be performed for each configurable logic block, where this scaling may be absorbed within the functionality of the clocked registers.

Functional unit 1502 may be synthesized in various ways. For example, fuses, or anti-fuses, may be "blown" (programmed) to provide the desired currents so that the variable node w to its desired level.

Figure 16:
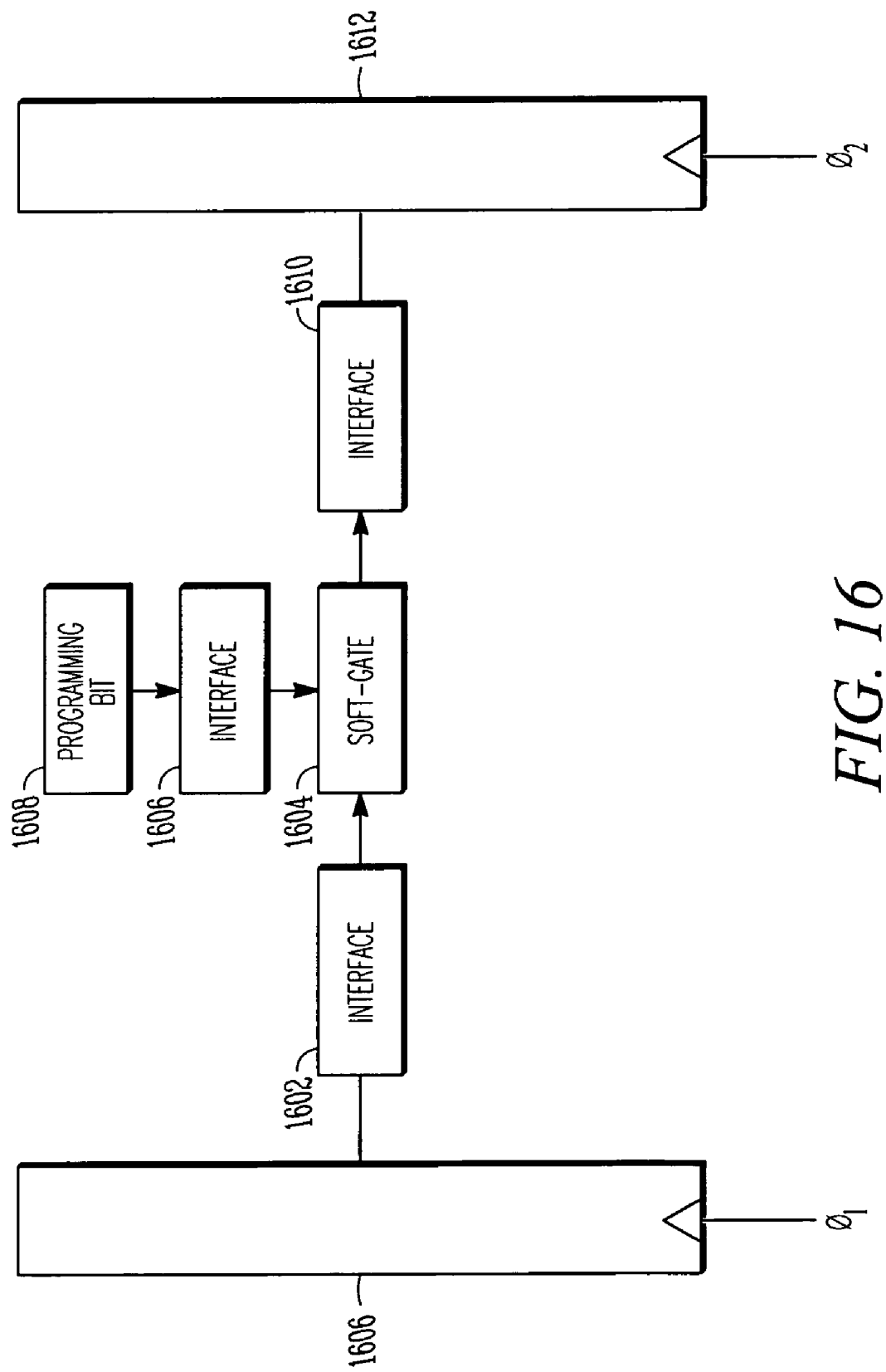
FIG. 16 illustrates a configurable logic block showing interface circuit blocks according to an embodiment of the present invention.

It should be appreciated that FIG. 15 is a simplified abstraction, and that additional interface circuits may be employed. For example, the soft-gate propagates currents indicative of probabilities, but input lines 1514a and 1514b have voltages indicative of input bits, and output line 1516 has a voltage indicative of an output bit. When clocked register 1508 is clocked, its state is updated to represent the input bits, that is, the input bits are stored. Accordingly, an interface circuit may be employed to source currents to the soft-gate that represent these stored input bits. This is illustrated in FIG. 16, where interface circuit 02 sources currents to soft-gate 1604, where these currents are indicative of the stored bits in clocked register 1606. Similarly, interface circuit 1606 sources currents to soft-gate 1604 in response to the state of programming bit circuit 1608.

The output of soft-gate 1604 is a set of currents, again representing probabilities. Interface circuit 1610 is coupled to output clocked register 1612 so that the state of clocked register 1612 is updated when it is clocked to represent this set of output currents. The resulting output bits stored in clocked register 16112 may then be provided as input to other configurable logic blocks.

Figure 17:
FIG. 17 illustrates a high-level abstractions of a portion of a computer system in which embodiments of the present invention may find application.

Configurable logic blocks may find use in various systems, such as illustrated in FIG. 17. FIG. 17 illustrates a portion of a computer system employing microprocessor 1702, chipset 1704 and system memory 1706. It should be noted that a chipset may encompass a collection of separate chips, a single chip, or a portion of a chip. As an example of the latter, a chipset may be integrated with a microprocessor. A chipset provides an interface between a microprocessor and other functional units, such as a graphic processor or system memory, for example. Locally asynchronous, block-level synchronous configurable logic blocks employing sub-threshold circuits may find applications in microprocessor 1702, chipset 1704, or both. Of course, such configurable logic blocks are not limited to merely these applications.

Configurable logic blocks may also include sub-threshold, current mode logic circuits.

Various modifications may be made to the disclosed embodiments without departing from the scope of the invention as claimed below.

It is to be understood in these letters patent that the meaning of "A is connected to B", where A or B may be, for example, a node or device terminal, is that A and B are connected to each other so that the voltage potentials of A and B are substantially equal to each other. For example, A and B may be connected by way of an interconnect, transmission line, etc. In integrated circuit technology, the "interconnect" may be exceedingly short, comparable to the device dimension itself. For example, the gates of two transistors may be connected to each other by polysilicon or copper interconnect that is comparable to the gate length of the transistors. As another example, A and B may be connected to each other by a switch, such as a transmission gate, so that their respective voltage potentials are substantially equal to each other when the switch is ON.

It is also to be understood that the meaning of "A is coupled to B" is that either A and B are connected to each other as described above, or that, although A and B may not be connected to each other as described above, there is nevertheless a device or circuit that is connected to both A and B. This device or circuit may include active or passive circuit elements. For example, A may be connected to a circuit element which in turn is connected to B.

It is also to be understood in these letters patent that a "current source" may mean either a current source or a current sink. Similar remarks apply to similar phrases, such as, "to source current".

It is also to be understood in these letters patent that various circuit blocks, such as current mirrors, amplifiers, etc., may include switches so as to be switched in or out of a larger circuit, and yet such circuit blocks may still be considered connected to the larger circuit because the various switches may be considered as included in the circuit block.

Throughout the description of the embodiments, various mathematical relationships are used to describe relationships among one or more quantities. For example, a mathematical relationship may express a relationship by which a quantity is derived from one or more other quantities by way of various mathematical operations, such as addition, subtraction, multiplication, division, etc. More simply, a quantity may be set to some known value, such as a real number, which is merely a trivial mathematical relationship. These numerical relationships are in practice not satisfied exactly, and should therefore be interpreted as "designed for" relationships. That is, one of ordinary skill in the art may design various working embodiments to satisfy various mathematical relationships, but these relationships can only be met within the tolerances of the technology available to the practitioner. In the following claims, the word "substantially" is used to reflect this fact. For example, a claim may recite that one resistance is substantially equal to another resistance, or that one voltage is substantially equal to another voltage. Or, a claim may relate one quantity to one or more other quantities by way of stating that these quantities substantially satisfy or are substantially given by a mathematical relationship or equation. It is to be understood that "substantially" is a term of art, and is meant to convey the principle discussed above that mathematical relationships, equalities, and the like, cannot be met with exactness, but only within the tolerances of the technology available to a practitioner of the art under discussion.

What is claimed is:

1. A circuit comprising:
   an input clocked register;
   a programming circuit having a state indicative of a programming bit;
   a soft-gate comprising
      an input variable node coupled to the input clocked register;
      a programmable variable node responsive to the state of the programming circuit; and
      an output variable node; and
   an output clocked register coupled to the output variable node.

2. The circuit as set forth in claim 1, the programming circuit comprising a memory to store the programming bit.

3. The circuit as set forth in claim 1, the programming circuit comprising a fuse having a state indicative of the programming bit.

4. The circuit as set forth in claim 1, the soft-gate comprising a CMOS circuit operating in a sub-threshold region.

5. The circuit as set forth in claim 1, further comprising a clock generator to provide a first clock signal to clock the input clocked register and a second clock signal to clock the output clocked register.

6. The circuit as set forth in claim 1, the input variable node comprising a first input port and a second input port, wherein the input clocked register has a state indicative of a set of input bits, the circuit further comprising:
   an input interface circuit to source to the first input node a first current and to the second input node a second current, where the first and second currents are indicative of the set of input bits.

7. The circuit as set forth in claim 6, wherein the second current is complementary to the first current.

8. The circuit as set forth in claim 1, wherein the output variable node sinks a first output current and a second output current, the circuit further comprising:
   an output interface circuit coupled to the output clocked register so that the output clocked register when clocked has a state indicative of a set of output bits representative of the first and second output currents.

9. The circuit as set forth in claim 8, the input variable node comprising a first input port and a second input port, wherein the input clocked register has a state indicative of a set of input bits, the circuit further comprising
   an input interface circuit to source to the first input node a first current and to the second input node a second current, where the first and second currents are indicative of the set of input bits.

10. A circuit comprising:
    an input clocked register having a state indicative of a first set of input bits;
    a soft-gate comprising
       a first input variable node comprising a first input port and a second input port; and
       an output variable node;
    an input interface circuit to source a first current and a second current to the first input node and the second input node of the first input variable node, respectively, where the first and second currents are indicative of the first set of input bits; and
    an output clocked register coupled to the output variable node.

11. The circuit as set forth in claim 10, wherein the state of the input clocked register is further indicative of a second set of input bits, the soft-gate further comprising a third input port coupled to the input interface circuit to sink a third current indicative of the second set of input bits.

12. The circuit as set forth in claim 11, the soft-gate sinking a first product current indicative of the product of the third current with the first current, and sinking a second product current indicative of the product of the third current with the second current.

13. The circuit as set forth in claim 12, the soft-gate comprising a programming circuit having a state indicative of a programming bit and comprising a first programming port and a second programming port, wherein the programming circuit is coupled to source a first programming current to the first programming port and a second programming current to the second programming port.

14. The circuit as set forth in claim 10, the soft-gate comprising a programming circuit having a state indicative of a programming bit and comprising a first programming port and a second programming port, wherein the programming circuit is coupled to source a first programming current to the first programming port and a second programming current to the second programming port.

15. A circuit comprising:
an input clocked register having a state indicative of a set of input bits;
a current-mode logic gate comprising
a bias transistor to provide a sub-threshold bias current;
a set of transistors to steer the sub-threshold bias current in response to the set of input bits; and
an output port to provide an output differential voltage in response to the steered sub-threshold bias current;
an interface circuit to restore the output differential voltage to an output logic level; and
an output clocked register having a state indicative of the output logic level when clocked.

16. The circuit as set forth in claim 15, further comprising a feedback circuit to bias the bias transistor in response to the output differential voltage.

17. The circuit as set forth in claim 15, further comprising a programming circuit having a state indicative of a programming bit to program the current-mode logic gate.

18. A system comprising:
a microprocessor; and
a chipset in communication with the microprocessor, the chipset comprising
an input clocked register;
a programming circuit having a state indicative of a programming bit;
a soft-gate comprising
an input variable node coupled to the input clocked register;
a programmable variable node responsive to the state of the programming circuit; and
an output variable node; and
an output clocked register coupled to the output variable node.

19. The system as set forth in claim 18, the programming circuit comprising a memory to store the programming bit.

20. The system as set forth in claim 18, the programming circuit comprising a fuse having a state indicative of the programming bit.

21. The system as set forth in claim 18, the input variable node comprising a first input port and a second input port, wherein the input clocked register has a state indicative of a set of input bits, the chipset further comprising:
an input interface circuit to source to the first input node a first current and to the second input node a second current, where the first and second currents are indicative of the set of input bits.

* * * * *